US012772501B2

(12) United States Patent
Sugimoto et al.

(10) Patent No.: US 12,772,501 B2
(45) Date of Patent: *Oct. 20, 2026

(54) POWER DEVICE HAVING OXIDE SEMICONDUCTOR LAYER WITH A LARGE BAND GAP AND FIELD EFFECT MOBILITY

(71) Applicant: FLOSFIA INC., Kyoto (JP)

(72) Inventors: Masahiro Sugimoto, Kyoto (JP); Yasushi Higuchi, Kyoto (JP)

(73) Assignee: FLOSFIA INC., Kyoto (JP)

( * ) Notice: Subject to any disclaimer, the term of this patent is extended or adjusted under 35 U.S.C. 154(b) by 1067 days.

This patent is subject to a terminal disclaimer.

(21) Appl. No.: 17/826,516

(22) Filed: May 27, 2022

(65) Prior Publication Data

US 2022/0285557 A1 Sep. 8, 2022

Related U.S. Application Data

(63) Continuation-in-part of application No. PCT/JP2020/043518, filed on Nov. 20, 2020.

(30) Foreign Application Priority Data

Nov. 29, 2019 (JP) ................................ 2019-217102

(51) Int. Cl.

*H10D 30/67* (2025.01)
*H10D 30/01* (2025.01)
*H10D 62/80* (2025.01)

(52) U.S. Cl.

CPC ..... *H10D 30/6755* (2025.01); *H10D 30/6728* (2025.01); *H10D 30/6757* (2025.01); *H10D 62/80* (2025.01); *H10D 30/031* (2025.01)

(58) Field of Classification Search

CPC .......... H10D 30/6755; H10D 30/6757; H10D 30/6728; H10D 62/80; H10D 30/031; H01L 21/0242

See application file for complete search history.

(56) References Cited

U.S. PATENT DOCUMENTS 5,763,655 A 6/1998 Patois et al.
5,989,785 A 11/1999 Ishihara et al.
12,284,822 B2 * 4/2025 Sugimoto .............. C23C 16/40
2014/0131696 A1 * 5/2014 Ono ...................... H10D 99/00 257/43
2014/0225104 A1 8/2014 Yamazaki et al.
(Continued)

FOREIGN PATENT DOCUMENTS

JP 8-227793 9/1996
JP 9-25255 1/1997
(Continued)

OTHER PUBLICATIONS

Request for the Submission of an Opinion issued Apr. 13, 2024 in corresponding Korean Patent Application No. 10-2022-7022136, with English translation.
(Continued)

*Primary Examiner* — Alonzo Chambliss
(74) *Attorney, Agent, or Firm* — Wenderoth, Lind & Ponack, L.L.P.

(57) ABSTRACT

A semiconductor device including at least a crystalline oxide semiconductor layer, which has a band gap of 3 eV or more and a field-effect mobility of 30 $cm^2/V{\cdot}s$ or higher.

4 Claims, 10 Drawing Sheets

(56) References Cited

U.S. PATENT DOCUMENTS

| | | | | |
|---|---|---|---|---|
| 2015/0325659 | A1* | 11/2015 | Hitora | H01L 21/02433 257/43 |
| 2017/0186843 | A1 | 6/2017 | Hosaka et al. | |
| 2017/0278706 | A1* | 9/2017 | Oda | H10D 99/00 |
| 2017/0288061 | A1 | 10/2017 | Sasaki et al. | |
| 2018/0061952 | A1 | 3/2018 | Tokuda et al. | |
| 2019/0355591 | A1 | 11/2019 | Yamazaki et al. | |

FOREIGN PATENT DOCUMENTS

| | | | |
|---|---|---|---|
| JP | 11-21687 | | 1/1999 |
| JP | 2005-340308 | | 12/2005 |
| JP | 2013-58637 | | 3/2013 |
| JP | 2013175747 | A * | 9/2013 |
| JP | 2016-25256 | | 2/2016 |
| JP | 2016-51796 | | 4/2016 |
| JP | 2017-128492 | | 7/2017 |
| JP | 2018-035044 | | 3/2018 |
| JP | 2018-82144 | | 5/2018 |
| JP | 2018-186246 | | 11/2018 |
| JP | 2019-48766 | | 3/2019 |
| WO | 2013/035843 | | 3/2013 |

OTHER PUBLICATIONS

International Search Report issued Mar. 2, 2021 in corresponding International Application No. PCT/JP2020/043518.

Kaneko, Kentaro, "Growth and physical properties of corundum-structured gallium oxide alloy thin films", Dissertation, Kyoto Univ., Mar. 2013, pp. 1-116, w/English Abstract.

Tatsuya, Takemoto, EE Times, Japan "power device gallium oxide" Thermal conductivity, p-type overcoming issues and putting it into practical use. [online], Retrieved Jun. 21, 2016, from http://eetimes.jp/ee/articles/1402/27/news028_2.html, pp. 1-10, w/English translation.

Koffyberg, F.P., "Optical Bandgaps and Electron Affinities of Semiconducting $Rh_2O_3$(I) and $Rh_2O_3$(III)", J. Phys. Chem. Solids vol. 53, No. 10, pp. 1285-1288, 1992.

Hosono, Hideo, "Functional development of oxide semiconductor" Physics Research, Electronic version, vol. 3, No. 1, 031211, pp. 1-15 Hosono, (Combined in one volume of Sep. 2013 and Feb. 2014), w/English translation.

Extended European Search Report issued Dec. 1, 2023 in corresponding European Patent Application No. 20894570.9.

Elaheh Ahmadi et al., "Materials issues and devices of $\alpha$- and $\beta$-$Ga_2O_3$", Journal of Applied Physics 126, 160901, pp. 160901-1-160901-18, Published Online: Oct. 30, 2019.

Notice of Reasons for Refusal issued Dec. 10, 2024 in corresponding Japan Patent Application No. 2021-561392, with English translation.

Office Action issued Apr. 22, 2025 in corresponding Taiwanese Patent Application No. 109141114, with English language translation.

Jiyeon Ma et al., "Asymmetric Double-Gate $\beta$-$Ga_2O_3$ Nanomembrane Field-Effect Transistor for Energy-Efficient Power Devices", Advanced Electronic Materials, vol. 5, pp. 1-7, 2019.

Request for the Submission of an Opinion issued Jan. 22, 2026 in corresponding Korean Application No. 10-2022-7022136, with English translation.

Notice of Reasons for Refusal issued Jun. 16, 2026 in corresponding Japanese Patent Application No. 2025-121877, with English translation.

* cited by examiner (a)

(b)

(a)

(b)

POWER DEVICE HAVING OXIDE SEMICONDUCTOR LAYER WITH A LARGE BAND GAP AND FIELD EFFECT MOBILITY

CROSS REFERENCE TO RELATED APPLICATION

This application is a continuation-in-part application of International Patent Application No. PCT/JP2020/043518 (filed on Nov. 20, 2020), which claims the benefit of priority from Japanese Patent Application No. 2019-217102 (filed on Nov. 29, 2019).

The entire contents of the above applications, which the present application is based on, are incorporated herein by reference.

1. Field of the Invention

The present disclosure relates to a semiconductor device that is useful as a power device and the like and to a semiconductor system including the semiconductor device.

2. Description of the Related Art

A semiconductor device using gallium oxide ($Ga_2O_3$) with a wide band gap receives attention as a next-generation switching element that can achieve high withstand voltage, low loss, and high heat resistance, and is expected to be applied to power semiconductor devices such as an inverter. In addition, it is also expected that this semiconductor device finds application as light-receiving or emitting devices such as an LED and a sensor due to a wide band gap thereof such gallium oxide makes band gap control possible by mixing thereinto indium or aluminum or a combination of indium and aluminum and constitutes a very attractive family of materials as InAlGaO-based semiconductors. Here, InAlGaO-based semiconductors indicate InxAlYGazO$_3$ ($0 \leq X \leq 2$, $0 \leq Y \leq 2$, $0 \leq Z \leq 2$, X+Y+Z=1.5 to 2.5) and may be regarded as a family of materials including gallium oxide.

In recent years, a gallium oxide-based p-type semiconductor has been studied, and it is known that a substrate exhibiting p-type conductivity can be obtained by forming a β-$Ga_2O_3$-based crystal by the FZ method using MgO (a p-type dopant source), for example. Moreover, it is known that a p-type semiconductor is formed by ion implanting a p-type dopant into an α-$(Al_xGa_{1-x})_2O_3$ monocrystalline film formed by MBE. However, it is difficult to implement production of a p-type semiconductor by these methods and, in actuality, there is no report saying that a p-type semiconductor was successfully produced by these methods. For these reasons, a feasible p-type oxide semiconductor and a method of producing the p-type oxide semiconductor are eagerly anticipated.

Furthermore, using $Rh_2O_3$, $ZnRh_2O_4$ and the like, for example, in a p-type semiconductor has also been studied. When $Rh_2O_3$ is used, the problem is that the raw material concentration becomes particularly low at the time of film formation, which affects film formation, and it is difficult to produce a $Rh_2O_3$ monocrystal even with an organic solvent. Moreover, it has never been judged to be a p-type even by Hall effect measurement and the measurement itself has not been able to be conducted; in addition, as for measurement values, the Hall coefficient, for example, was less than or equal to a measurement limit (0.2 cm$^3$/C), which posed a practical problem. Furthermore, $ZnRh_2O_4$ has low mobility and a narrow band gap, which makes it impossible to use $ZnRh_2O_4$ in LEDs and power devices. Thus, these are not necessarily satisfactory.

In addition to $Rh_2O_3$, $ZnRh_2O_4$ and the like, various p-type oxide semiconductors have been studied as a wide-band-gap semiconductor. When delafossite, oxychalcogenide and the like as a p-type semiconductor is used, these semiconductors have a mobility of about 1 cm$^2$/V·s or lower and have poor electrical characteristics, resulting in a poor pn junction between these semiconductors and n-type next-generation oxide semiconductors such as α-$Ga_2O_3$.

It is to be noted that $Ir_2O_3$ is known. For example, it is known that $Ir_2O_3$ is used as an iridium catalyst. Moreover, it is known that $Ir_2O_3$ is used in a dielectric. Furthermore, it is known that $Ir_2O_3$ in an electrode. However, no cases are known in which $Ir_2O_3$ is used in a p-type semiconductor. The applicant and others have recently studied the use of $Ir_2O_3$ as a p-type semiconductor and conducted research and development.

Power devices such as a transistor require low on-resistance and high withstand voltage and there are still problems in electrical characteristics such as a leakage current. Gallium oxide ($Ga_2O_3$) in particular has a dielectric breakdown field strength of about 10 and low on-resistance and has good semiconductor characteristics; however, a problem in electrical characteristics makes it impossible to take full advantage of these semiconductor characteristics. An oxide semiconductor having a band gap of 3 eV or more has a similar problem. Specifically, for an oxide semiconductor, a junction leakage current that is likely to be generated by ion implantation affects electrical characteristics, for example. For these reasons, a semiconductor device that effectively uses a good semiconductor material such as gallium oxide ($Ga_2O_3$) by solving these problems of electrical characteristics and the like and can achieve high withstand voltage, low loss, and high heat resistance is eagerly anticipated.

SUMMARY OF THE INVENTION

According to an example of the present disclosure, there is provided a semiconductor device comprising at least, a crystalline oxide semiconductor layer which has a band gap of 3 eV or more, and a field-effect mobility of 30 cm$^2$/V·s or higher.

Thus, a semiconductor device of the present disclosure is useful as a power device and the like, and has good semiconductor characteristics.

DETAILED DESCRIPTION

Figure 1:
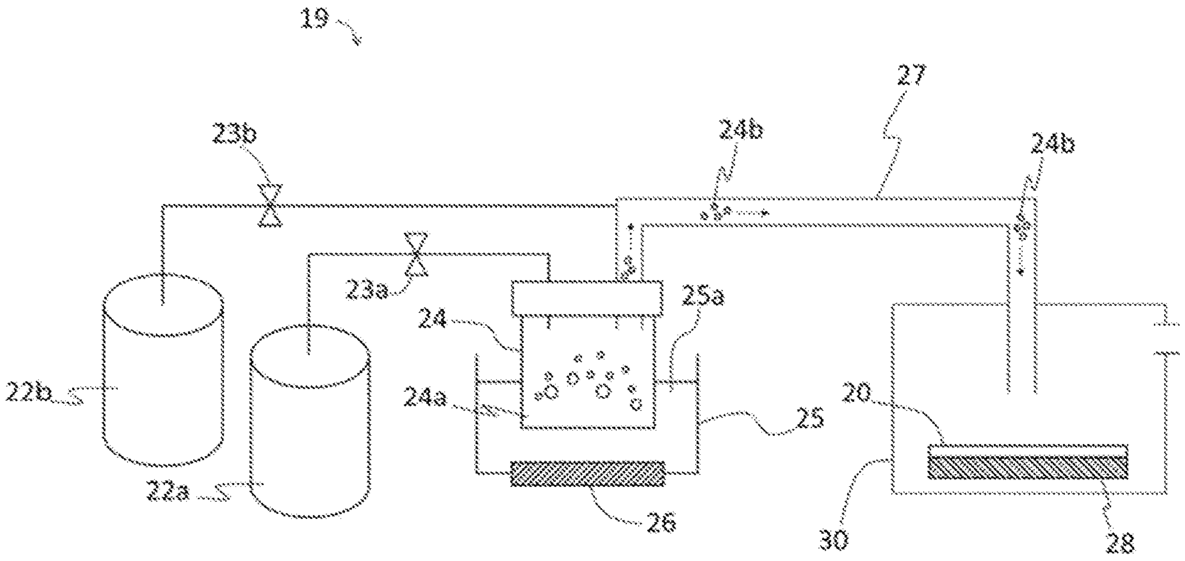
FIG. 1 is a schematic configuration diagram of film forming equipment (mist CVD equipment) that is suitably used in the present disclosure.

The inventors of the present disclosure found out that a semiconductor device including a high-resistance oxide film, which is placed in a direction in which a current flows, the high-resistance oxide film having a resistance of $1.0\times10^6$ Ω·cm or higher, has significantly improved electrical characteristics. The inventors of the present disclosure successfully produced high-mobility transistors of a gallium oxide semiconductor and found out that the transistors may solve the above-mentioned conventional problems. According to an example of the present disclosure, there is provided a semiconductor device having semiconductor characteristics useful as a power device.

Embodiments of the present disclosure will be described below with reference to the accompanying drawings. In the following description, the same parts and components are designated by the same reference numerals. The present embodiment includes, for example, the following disclosures.

[Structure 1]

A semiconductor device including at least: a crystalline oxide semiconductor layer which has a band gap of 3 eV or more; and a field-effect mobility of 30 $cm^2$/V·s or higher.

[Structure 2]

The semiconductor device according to [Structure 1], wherein the field-effect mobility is 60 $cm^2$/V·s or higher.

[Structure 3]

The semiconductor device according to [Structure 1] or [Structure 2], wherein the crystalline oxide semiconductor layer contains a p-type dopant.

[Structure 4]

The semiconductor device according to any one of [Structure 1] to [Structure 3], wherein additionally a high-resistance oxide film is placed in the crystalline oxide semiconductor layer, and wherein the high-resistance oxide film has a resistance of $1.0\times10^6$ Ω·cm or higher.

[Structure 5]

The semiconductor device according to [Structure 4], wherein the high-resistance oxide film has a resistance of $1.0\times10^{10}$ Ω·cm or higher.

[Structure 6]

The semiconductor device according to [Structure 4] or [Structure 5], further including: a channel formation region, below which the high-resistance oxide film is placed.

[Structure 7]

The semiconductor device according to any one of [Structure 4] to [Structure 6], wherein the high-resistance oxide film is a current block layer.

[Structure 8]

The semiconductor device according to any one of [Structure 1] to [Structure 7], wherein the crystalline oxide semiconductor layer has a corundum structure.

[Structure 9]

The semiconductor device according to any one of [Structure 1] to [Structure 8], wherein the crystalline oxide semiconductor layer contains $Ga_2O_3$.

[Structure 10]

The semiconductor device according to any one of [Structure 1] to [Structure 9], wherein the semiconductor device is a vertical device.

[Structure 11]

The semiconductor device according to any one of [Structure 1] to [Structure 10], wherein the semiconductor device is a power device.

[Structure 12]

The semiconductor device according to any one of [Structure 1] to [Structure 11], wherein the semiconductor device is a MOSFET.

[Structure 13]

The semiconductor device according to any one of [Structure 1] to [Structure 12], wherein an on/off ratio is 1000 or more.

[Structure 14]

The semiconductor device according to any one of [Structure 1] to [Structure 13], wherein the semiconductor device is normally off.

[Structure 15]

A semiconductor system including: a semiconductor device, which is the semiconductor device according to any one of [Structure 1] to [Structure 14].

A semiconductor device in an embodiment of the present disclosure includes a crystalline oxide semiconductor layer which has a band gap of 3 eV or more and a field-effect mobility of the semiconductor device that is 30 $cm^2$/V·s or higher. In an embodiment of the present disclosure, the band gap of the crystalline oxide semiconductor layer is preferably 4.5 eV or more and more preferably 5 eV or more. Moreover, it is preferable that the crystalline oxide semiconductor layer has a corundum structure and it is also preferable that the crystalline oxide semiconductor layer is formed of an oxide semiconductor film. It is preferable that the oxide semiconductor film is an oxide semiconductor film containing gallium oxide ($Ga_2O_3$) or a mixed crystal thereof as a major component. Furthermore, in an embodiment of the present disclosure, it is preferable that the field-effect mobility is 60 $cm^2$/V·s or higher. Such a preferred semiconductor device can be easily obtained by producing the semiconductor device by forming a high-resistance oxide film having a resistance of $1.0\times10^6$ &·cm or higher in the crystalline oxide semiconductor layer in a direction in which a current flows. It is to be noted that the field-effect mobility generally means the maximum field-effect mobility and refers to the field-effect mobility of a semiconductor device such as a transistor, which is calculated using the output current data corresponding to the semiconductor device. Moreover, according to the above-described preferred aspects, it is possible to easily achieve an on/off ratio of 1000 or more (more preferably 100000 or more). It is to be noted that the "on/off ratio" refers to the ratio of an on current of the semiconductor device to an off current thereof. For example, when the semiconductor device includes at least a source electrode and a drain electrode, the off current refers to a current that flows between the source electrode and the drain electrode when the semiconductor device is off and the on current refers to a current that flows between the source electrode and the drain electrode when the semiconductor device is on. In addition, when the semiconductor device includes at least a gate electrode, a source electrode, and a drain electrode, the above-described preferred semiconductor device can be easily obtained by producing the semiconductor device by forming a high-resistance oxide film having a resistance of $1.0\times10^6$ Ω·cm or higher between the source electrode and the drain electrode. Moreover, when the semiconductor device is a semiconductor device in which at least a gate electrode, a source electrode, a drain electrode and a high-resistance oxide film are individually formed directly on a substrate or with another layer placed therebetween, the above-described preferred semiconductor device can be easily obtained by producing the semiconductor device by forming a high-resistance oxide film having a resistance of $1.0\times10^6$ Ω·cm or higher between the source electrode or/and the drain electrode and the substrate.

The high-resistance oxide film is not limited to a particular oxide film as long as the oxide film is an oxide film having a resistance of $1.0\times10^6$ Ω·cm or higher; in an embodiment of the present disclosure, the resistance of the high-resistance oxide film is preferably $1.0\times10^{10}$ Ω·cm or higher and more preferably $1.0\times10^{12}$ Ω·cm or higher. It is to be noted that the resistance of the high-resistance oxide film here means the electric resistivity [Ω·cm] of the high-resistance oxide film. The resistance can be measured by forming measuring electrodes in the high-resistance oxide film and passing a current. The upper limit of the resistance is not limited to a particular upper limit and is preferably $1.0\times10^{15}$ Ω·cm and more preferably $1.0\times10^{14}$ Ω·cm. Moreover, in an embodiment of the present disclosure, it is preferable that the high-resistance oxide film is a current block layer. By using the high-resistance oxide film as a current block layer, it is possible to achieve better electrical characteristics.

A constituent material for the high-resistance oxide film is not limited to a particular constituent material; in an embodiment of the present disclosure, it is preferable that the constituent material for the high-resistance oxide film is a crystal film. The crystal film may be a polycrystalline film or a monocrystalline film. The crystal structure of the crystal film is also not limited to a particular crystal structure; in an embodiment of the present disclosure, it is preferable that the crystal film has a corundum structure. Moreover, the constituent material for the high-resistance oxide film also preferably contains gallium and more preferably contains $Ga_2O_3$. Furthermore, in an embodiment of the present disclosure, it is preferable that the high-resistance oxide film contains a p-type dopant. In addition, according to the present disclosure, it is preferable that the semiconductor device further includes a channel formation region, below which the high-resistance oxide film is placed. According to these preferred aspects, it is possible to easily achieve a high field-effect mobility of 30 $cm^2$/V·s or higher (more preferably 60 $cm^2$/V·s or higher). It is to be noted that the field-effect mobility generally means the maximum field-effect mobility. Moreover, according to the above-described preferred aspects, it is possible to easily achieve an on/off ratio of 1000 or more (more preferably 100000 or more).

It is preferable that the high-resistance oxide film is an oxide semiconductor film containing gallium oxide ($Ga_2O_3$) or a mixed crystal thereof as a major component. The oxide semiconductor film in the crystalline oxide semiconductor layer or the high-resistance oxide film may be a p-type semiconductor film or an n-type semiconductor film. Examples of the gallium oxide include $\alpha$-$Ga_2O_3$, $\beta$-$Ga_2O_3$, and $\varepsilon$-$Ga_2O_3$, of which $\alpha$-$Ga_2O_3$ is preferable. Moreover, examples of the mixed crystal of the gallium oxide include a mixed crystal of the gallium oxide and one or two or more types of metal oxides, and suitable examples of the metal oxide include aluminum oxide, indium oxide, iridium oxide, rhodium oxide, and iron oxide. It is to be noted that, for example, when an oxide semiconductor film contains $\alpha$-$Ga_2O_3$ as a "major component", the oxide semiconductor film only has to contain $\alpha$-$Ga_2O_3$ with the atom ratio of gallium in metallic elements of the oxide semiconductor film being 0.5 or more. In an embodiment of the present disclosure, the atom ratio of gallium in metallic elements of the oxide semiconductor film is preferably 0.7 or more and more preferably 0.8 or more. In addition, for example, when an oxide semiconductor film contains a mixed crystal of $\alpha$-$Ga_2O_3$ and $\alpha$-$Al_2O_3$ as a major component, the oxide semiconductor film only has to contain the mixed crystal with the total atom ratio of gallium and aluminum in metallic elements of the oxide semiconductor film being 0.5 or more; furthermore, in an embodiment of the present disclosure, the atom ratio of gallium in metallic elements of the oxide semiconductor film is preferably 0.5 or more and more preferably 0.7 or more.

Moreover, the film thickness of the high-resistance oxide film is not limited to a particular film thickness and may be 1 μm or less or 1 μm or more; in an embodiment of the present disclosure, the film thickness of the high-resistance oxide film is preferably 1 μm or more, more preferably 1 to 40 μm, and most preferably 1 to 25 μm. The surface area of the semiconductor film is not limited to a particular surface area and may be 1 $mm^2$ or more or 1 $mm^2$ or less. It is to be noted that the high-resistance oxide film may be a single layer film or a multilayer film.

It is preferable that the high-resistance oxide film is an oxide semiconductor film containing a dopant. The dopant is not limited to particular dopant unless it interferes with the present disclosure and may be publicly known dopant. Examples of the dopant include a p-type dopant such as Mg, Zn, Ca or the like. The content of the dopant in the composition of the oxide semiconductor film is preferably 0.00001 at % or more, more preferably 0.00001 to 20 at %, and most preferably 0.0001 to 20 at %.

It is to be noted that the p-type dopant is not limited to particular p-type dopant as long as the p-type dopant may provide the oxide semiconductor film with conductivity as a p-type semiconductor film and may be publicly known p-type dopant. Examples of the p-type dopant include Mg, H, Li, Na, K, Rb, Cs, Fr, Be, Ca, Sr, Ba, Ra, Mn, Fe, Co, Ni, Pd, Cu, Ag, Au, Zn, Cd, Hg, Tl, Pb, N, P and the like, two or more types of these elements and so forth; in an embodiment of the present disclosure, it is preferable that the p-type dopant is Mg, Zn, or Ca.

Unlike a conventional high-resistance oxide layer formed by ion implantation, the high-resistance oxide film is generally obtained by performing film formation using an epitaxial crystal growth method and a forming method and the like are not limited to particular method and the like. The epitaxial crystal growth method is not limited to a particular method unless it interferes with the present disclosure and may be a publicly known method. Examples of the epitaxial crystal growth method include CVD, MOCVD, MOVPE, mist CVD, mist epitaxy, MBE, HVPE, a pulse growth method or the like. In an embodiment of the present disclosure, it is preferable that the epitaxial crystal growth method is mist CVD or mist epitaxy.

In an embodiment of the present disclosure, it is preferable that the film formation is performed by atomizing a raw material solution containing metal (an atomization process), conveying the obtained atomized droplets to an area near a base by carrier gas (a conveying process), and making the atomized droplets thermally react with each other (a film formation process).

(Raw Material Solution)

The raw material solution is not limited to a particular raw material solution as long as the raw material solution contains metal as a film formation material and can be atomized, and may contain an inorganic material or an organic material. The metal may be elemental metal or a metal compound and is not limited to particular metal unless it interferes with the present disclosure, and examples thereof include one or two or more types of metal selected from gallium (Ga), iridium (Ir), indium (In), rhodium (Rh), aluminum (Al), gold (Au), silver (Ag), platinum (Pt), copper (Cu), iron (Fe), manganese (Mn), nickel (Ni), palladium (Pd), cobalt (Co), ruthenium (Ru), chromium (Cr), molybdenum (Mo), tungsten (W), tantalum (Ta), zinc (Zn), lead (Pb), rhenium (Re), titanium (Ti), tin (Sn), magnesium (Mg), calcium (Ca), and zirconium (Zr); in an embodiment of the present disclosure, the metal preferably contains at least one or two or more types of metal in the periods 4 to 6 in the periodic table, more preferably contains at least gallium, indium, aluminum, rhodium, or iridium, and most preferably contains at least gallium. By using such preferred metal, it is possible to form an epitaxial film that may be more suitably used in semiconductor devices and the like.

In an embodiment of the present disclosure, what is obtained by dissolving or dispersing the metal in an organic solvent or water in the form of a complex or salt may be suitably used as the raw material solution. Examples of the form of a complex include an acetylacetonato complex, a carbonyl complex, an ammine complex, and a hydrido complex. Examples of the form of salt include organometallic salt (for example, metallic acetate, metallic oxalate, and metallic citrate), metal sulfide salt, metal nitrate salt, metal phosphate salt, and metal halide salt (for example, metal chloride salt, metal bromide salt, and metal iodide salt).

A solvent of the raw material solution is not limited to a particular solvent unless it interferes with the present disclosure, and may be an inorganic solvent such as water, an organic solvent such as alcohol, or a mixed solvent of an inorganic solvent and an organic solvent. In an embodiment of the present disclosure, it is preferable that the solvent contains water.

Moreover, an additive such as hydrohalic acid or oxidizer may be mixed into the raw material solution. Examples of the hydrohalic acid include hydrobromic acid, hydrochloric acid, and hydriodic acid. Examples of the oxidizer include peroxides such as hydrogen peroxide ($H_2O_2$), sodium peroxide ($Na_2O_2$), barium peroxide ($BaO_2$), and benzoyl peroxide $(C_6H_5CO)_2O_2$, hypochlorous acid (HClO), perchloric acid, nitric acid, ozone water, and organic peroxides such as peroxyacetic acid and nitrobenzene. The percentage of the additive in the raw material solution is not limited to a particular percentage and preferably 0.001 to 50 vol % and more preferably 0.01 to 30 vol % of the raw material solution.

The raw material solution may contain a dopant. The dopant is not limited to particular dopant unless it interferes with the present disclosure. Examples of the dopant include the above-described n-type dopant or p-type dopant. In general, the concentration of the dopant may be about $1\times10^{16}/cm^3$ to $1\times10^{22}/cm^3$ and the concentration of the dopant may be set at a low concentration of about $1\times10^{17}/cm^3$ or less, for example. Furthermore, according to the present disclosure, the raw material solution may be made to contain the dopant at a high concentration of about $1\times10^{20}/cm^3$ or more.

(Atomization Process)

The atomization process adjusts a raw material solution containing metal, atomizes the raw material solution, and generates atomized droplets. The proportion of the metal in the raw material solution is not limited to a particular proportion and is preferably 0.0001 to 20 mol/L in the whole of the raw material solution. An atomization method is not limited to a particular method as long as the method can atomize the raw material solution and may be a publicly known atomization method; in an embodiment of the present disclosure, an atomization method using ultrasonic vibrations is preferable. The atomized droplets (for example, mist) that are used in the present disclosure are more preferably atomized droplets that are suspended in the air with zero initial velocity which allows them to be conveyed while being suspended in the space, not being sprayed like a spray, for example. The droplet size of the atomized droplets is not limited to a particular size and may be a droplet of about a few mm; the droplet size is preferably 50 μm or less and more preferably 1 to 10 μm.

(Conveying Process)

In the conveying process, the atomized droplets are conveyed to the base by the carrier gas. The type of carrier gas is not limited to a particular type unless it interferes with the present disclosure and suitable examples thereof include oxygen, ozone, inert gas (for example, nitrogen and argon), reducing gas (hydrogen gas, forming gas and the like) or the like. Moreover, one type of carrier gas may be used; two or more types of carrier gas may be used and dilution gas (for example, 10-fold dilution gas) obtained by changing carrier gas concentration, for example, may be additionally used as second carrier gas. Furthermore, instead of one carrier gas supply point, two or more carrier gas supply points may be provided. The flow rate of carrier gas is not limited to a particular flow rate and is preferably 0.01 to 20 LPM and more preferably 0.1 to 10 LPM.

(Film Formation Process)

In the film formation process, a film is formed on the base by making the atomized droplets react with each other. The reaction is not limited to a particular reaction as long as it is a reaction by which a film is formed from the atomized droplets; in an embodiment of the present disclosure, a thermal reaction is preferable. The thermal reaction only has to make the atomized droplets react with each other by heat, and the reaction conditions and so forth are also not limited to particular reaction conditions and so forth unless they interfere with the present disclosure. In this process, the thermal reaction is generally carried out at a temperature equal to or higher than the evaporation temperature of a solvent of a raw material solution; the temperature is preferably not too high temperatures or lower, more preferably 850° C. or lower, and most preferably 650° C. or lower. Moreover, the thermal reaction may be carried out under any one of the following atmospheres: under vacuum, under a non-oxygen atmosphere, under a reducing gas atmosphere, and under an oxygen atmosphere and may be carried out under any one of the following conditions: under atmospheric pressure, under increased pressure, and under reduced pressure unless it interferes with the present disclosure; in an embodiment of the present disclosure, it is preferable that the thermal reaction is carried out under atmospheric pressure because, for example, this makes it easier to perform the calculation of the evaporation temperature and makes it possible to simplify the equipment and so forth. Furthermore, a film thickness may be set by adjusting the film formation time.

(Base)

The base is not limited to a particular base as long as the base can support the film. A material for the base is also not limited to a particular material unless it interferes with the present disclosure and the base may be a publicly known base, and the material for the base may be an organic compound or an inorganic compound. The base may have any shape and is effective for any shape, and examples of the shape thereof include a plate-like shape such as a flat plate-like shape or a disk-like shape, a fiber-like shape, a rod-like shape, a columnar shape, a prismatic shape, a tubular shape, a spiral shape, a spherical shape, and a ring-like shape; in an embodiment of the present disclosure, a substrate is preferable. The thickness of a substrate is not limited to a particular thickness in an embodiment of the present disclosure.

The substrate is not limited to a particular substrate as long as the substrate is a plate-like substrate and serves as a support of the semiconductor film. The substrate may be an insulator substrate, a semiconductor substrate, a metal substrate, or a conductive substrate; it is preferable that the substrate is an insulator substrate and it is also preferable that the substrate is a substrate having a metal film on the front surface thereof. Examples of the substrate include an underlying substrate containing a substrate material with a corundum structure as a main component, an underlying substrate containing a substrate material with a β-gallia structure as a main component, an underlying substrate containing a substrate material with a hexagonal structure as a main component, or the like. A "main component" here means that a substrate material with the above-described particular crystal structure constitutes preferably 50% or more, more preferably 70% or more, and further preferably 90% or more of all the components of a substrate material in terms of atom ratio, and a substrate material with the above-described particular crystal structure may constitute 100% of all the components of a substrate material in terms of atom ratio.

A substrate material is not limited to a particular substrate material unless it interferes with the present disclosure and may be a publicly known substrate material. Suitable examples of the substrate material with a corundum structure include $\alpha$-$Al_2O_3$ (a sapphire substrate), $\alpha$-$Ga_2O_3$ or the like, and more suitable examples include an a-plane sapphire substrate, an m-plane sapphire substrate, an r-plane sapphire substrate, a c-plane sapphire substrate, and an α-type gallium oxide substrate (a-plane, m-plane, or r-plane). Examples of an underlying substrate of which main component is a substrate material with a β-gallia structure include a $\beta$-$Ga_2O_3$ substrate, a mixed crystal substrate containing $Ga_2O_3$ and $Al_2O_3$, the content of $Al_2O_3$ being more than 0 wt % and 60 wt % or less, or the like. Moreover, examples of an underlying substrate of which main component is a substrate material with a hexagonal structure include a SiC substrate, a ZnO substrate, and a GaN substrate.

In an embodiment of the present disclosure, annealing treatment may be performed after the film formation process. The annealing treatment temperature is not limited to a particular temperature unless it interferes with the present disclosure, and the annealing treatment temperature is generally 300 to 650° C. and preferably 350 to 550° C. Moreover, the annealing treatment time is generally 1 minute to 48 hours, preferably 10 minutes to 24 hours, and more preferably 30 minutes to 12 hours. It is to be noted that the annealing treatment may be carried out under any atmosphere unless it interferes with the present disclosure; the annealing treatment is carried out preferably under a non-oxygen atmosphere and more preferably under a nitrogen atmosphere.

Moreover, in an embodiment of the present disclosure, the semiconductor film may be provided directly on the base or may be provided on the base with another layer such as a buffer layer or a stress relaxation layer placed therebetween. A method of forming each layer is not limited to a particular method and may be a publicly known method; in an embodiment of the present disclosure, mist CVD or mist epitaxy is preferable.

Hereinafter, film forming equipment 19 that is suitably used in mist CVD or mist epitaxy described above will be described using the drawing. The film forming equipment 19 of FIG. 1 includes a carrier gas supply source **22*a* that supplies carrier gas, a flow control valve 23*a* for adjusting the flow rate of the carrier gas fed from the carrier gas supply source 22*a*, a carrier gas (dilute) supply source 22*b* that supplies carrier gas (dilute), a flow control valve 23*b* for adjusting the flow rate of the carrier gas (dilute) fed from the carrier gas (dilute) supply source 22*b*, a mist generation source 24 in which a raw material solution 24*a* is housed, a container 25 in which water 25*a* is put, an ultrasonic vibrator 26 attached to the bottom of the container 25, a film formation chamber 30, a supply pipe 27 made of quartz and connecting the mist generation source 24 to the film formation chamber 30, and a hot plate (a heater) 28 placed inside the film formation chamber 30. A substrate 20 is placed on the hot plate 28**.

Then, the raw material solution **24*a* is housed in the mist generation source 24 as shown in FIG. 1. Next, the substrate 20 is used and placed on the hot plate 28 and the temperature inside the film formation chamber 30 is raised by activating the hot plate 28. Next, the carrier gas is supplied to the inside of the film formation chamber 30 from the carrier gas supply source 22 (22*a*, 22*b*) by opening the flow control valve 23 (23*a*, 23*b*) and the atmosphere inside the film formation chamber 30 is sufficiently replaced with the carrier gas, and then the flow rate of the carrier gas and the flow rate of the carrier gas (dilute) are individually adjusted. Next, the ultrasonic vibrator 26 is vibrated and the vibrations are transferred to the raw material solution 24*a* through the water 25*a*, whereby the raw material solution 24*a* is atomized and atomized droplets 24*b* are generated. The atomized droplets 24*b* are introduced into the film formation chamber 30 by the carrier gas, conveyed to the substrate 20, and thermally react with each other inside the film formation chamber 30 under atmospheric pressure, whereby a film is formed on the substrate 20**.

In an embodiment of the present disclosure, the film obtained by the film formation process may be used in a semiconductor device as it is, or the film may be used in a semiconductor device after using a publicly known method such as separating the film from the base or the like.

It is preferable that the semiconductor device includes a semiconductor layer and a substrate, between which the high-resistance oxide film is placed. This preferred semiconductor device makes it possible to obtain a horizontal semiconductor device with better electrical characteristics and more suitably use the horizontal semiconductor device as a power device.

Moreover, it is also preferable that the semiconductor device is a vertical device with the high-resistance oxide film having an opening, and this preferred semiconductor device makes it possible to obtain a horizontal semiconductor device with better electrical characteristics that may achieve high withstand voltage and high current and more suitably use the horizontal semiconductor device as a power device.

The semiconductor device is especially useful for power devices. Examples of the semiconductor device include transistors, of which a MOSFET is preferable. Moreover, it is preferable that the semiconductor device is normally off.

Examples of the transistors include a semiconductor device including at least a high-resistance oxide film, a gate insulating film, a gate electrode, a source electrode, and a drain electrode. In an embodiment of the present disclosure, the high-resistance oxide film may be used as a semiconductor layer. Moreover, the semiconductor device preferably includes a channel formation region and more preferably includes an inversion channel formation region.

The inversion channel formation region is generally provided between semiconductor regions exhibiting conductivity of a different type. For example, when the inversion channel formation region is provided in a p-type semiconductor layer, the inversion channel formation region is generally provided in a p-type semiconductor layer between semiconductor regions of an n-type semiconductor; when the inversion channel formation region is provided in an n-type semiconductor layer, the inversion channel formation region is generally provided in an n-type semiconductor layer between semiconductor regions of a p-type semiconductor. It is to be noted that a method of forming each semiconductor region may be similar to the method of forming the high-resistance oxide film.

Moreover, in an embodiment of the present disclosure, it is preferable that an oxide film containing at least one type of element of group 15 of the periodic table is stacked on the inversion channel formation region. Examples of the element include nitrogen (N) and phosphorus (P); in an embodiment of the present disclosure, the element is preferably nitrogen (N) or phosphorus (P) and more preferably phosphorus (P). For example, between a gate insulating film and the inversion channel formation region, by stacking an oxide film containing at least phosphorus on the inversion channel formation region, it is possible to prevent hydrogen from being diffused into an oxide semiconductor film and also reduce the interface state, which makes it possible to provide a semiconductor device, especially a semiconductor device of a wide-band-gap semiconductor, with better semiconductor characteristics. It is to be noted that, in an embodiment of the present disclosure, the oxide film more preferably contains at least the at least one type of element of group 15 of the periodic table and one or two or more types of metal of group 13 of the periodic table. Examples of the metal include aluminum (Al), gallium (Ga), and indium (In), of which Ga and/or Al is preferable and Ga is more preferable. Moreover, the oxide film is preferably a thin film, more preferably has a film thickness of 100 nm or less, and most preferably has a film thickness of 50 nm or less. By stacking such an oxide film, it is possible to more effectively suppress gate leakage and achieve better semiconductor characteristics. Examples of a method of forming the oxide film include a publicly known method and more specific examples thereof include a dry process and a wet process; it is preferable that the method is surface treatment performed on the inversion channel formation region by using phosphoric acid or the like.

Furthermore, in an embodiment of the present disclosure, it is preferable that a gate electrode is provided on the inversion channel formation region with a gate insulating film placed therebetween and it is also preferable that a gate electrode is provided on the inversion channel formation region and the oxide film with a gate insulating film placed therebetween. These configurations make it easy to prevent diffusion of hydrogen, for example, and make it possible to achieve better semiconductor characteristics.

The gate insulating film is not limited to a particular gate insulating film unless it interferes with the present disclosure and may be a publicly known insulating film. Suitable examples of the gate insulating film include an oxide film such as an oxide film containing at least $SiO_2$, $Si_3N_4$, $Al_2O_3$, GaO, AlGaO, InAlGaO, $AlInZnGaO_4$, AlN, $Hf_2O_3$, SiN, SiON, MgO, GdO, or phosphorus. A method of forming the gate insulating film may be a publicly known method and examples of such a publicly known forming method include a dry process and a wet process. Examples of the dry process include publicly known methods such as sputtering, vacuum evaporation, CVD, and PLD. Examples of the wet process include coating methods such as screen printing and die coating.

The gate electrode may be a publicly known gate electrode and such an electrode material may be a conductive inorganic material or a conductive organic material. In an embodiment of the present disclosure, the electrode material is preferably metal. The metal is not limited to particular metal and suitable examples thereof include at least one type of metal selected from groups 4 to 11 of the periodic table. Examples of metals of group 4 of the periodic table include titanium (Ti), zirconium (Zr), and hafnium (Hf), of which Ti is preferable. Examples of metals of group 5 of the periodic table include vanadium (V), niobium (Nb), and tantalum (Ta). Examples of metals of group 6 of the periodic table include one or two or more types of metal selected from chromium (Cr), molybdenum (Mo), and tungsten (W); in an embodiment of the present disclosure, Cr is preferable because Cr makes semiconductor characteristics such as switching characteristics better. Examples of metals of group 7 of the periodic table include manganese (Mn), technetium (Tc), and rhenium (Re). Examples of metals of group 8 of the periodic table include iron (Fe), ruthenium (Ru), and osmium (Os). Examples of metals of group 9 of the periodic table include cobalt (Co), rhodium (Rh), and iridium (Ir). Examples of metals of group 10 of the periodic table include nickel (Ni), palladium (Pd), and platinum (Pt), of which Pt is preferable. Examples of metals of group 11 of the periodic table include copper (Cu), silver (Ag), and gold (Au). Examples of a method of forming the gate electrode include a publicly known method and more specific examples thereof include a dry process and a wet process. Examples of the dry process include publicly known methods such as sputtering, vacuum evaporation, and CVD. Examples of the wet process include screen printing and die coating.

It is to be noted that, in an embodiment of the present disclosure, not only a gate electrode, but also a source electrode and a drain electrode are provided; like the gate electrode, each of the source electrode and the drain electrode may be a publicly known electrode and a method of forming each electrode may be a publicly known method.

Hereinafter, preferred embodiments in the present disclosure will be described more specifically using the drawings; the present disclosure is not limited to these embodiments.

(MOSFET)

Figure 2:
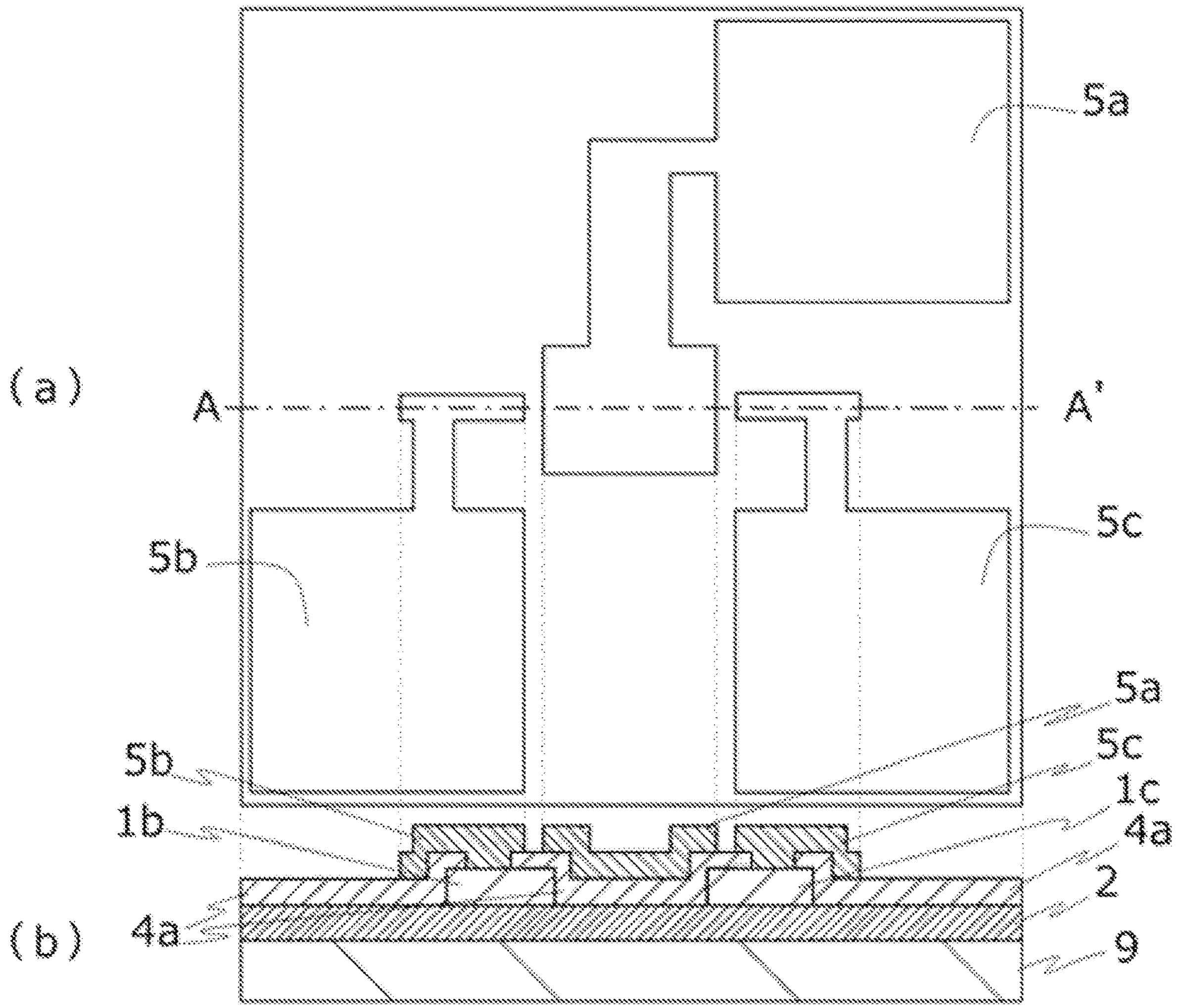
FIG. 2 is a diagram schematically showing a MOSFET of a first embodiment; (a) schematically showing a top surface of the MOSFET and (b) schematically showing a cross section taken along A-A' of (a).

Specific examples of the semiconductor device of the present disclosure include a MOSFET shown in FIG. 2. The MOSFET of FIG. 2 is a horizontal MOSFET and includes an n+-type semiconductor layer (an n+-type source layer) 1*b*, an n+-type semiconductor layer (an n+-type drain layer) 1*c*, a high-resistance oxide film 2 as a p-type semiconductor layer, a gate insulating film 4*a*, a gate electrode 5*a*, a source electrode 5*b*, a drain electrode 5*c*, and a substrate 9. It is to be noted that FIG. 2(*a*) is a top view of the MOSFET viewed from a zenith direction and schematically shows a top surface of the MOSFET. Moreover, FIG. 2(*b*) schematically shows a cross section of the MOSFET taken along A-A' of FIG. 2(*a*).

In an on-state of the MOSFET of FIG. 2, when a voltage is applied between the source electrode 5*b* and the drain electrode 5*c* and a voltage which is positive with respect to the source electrode 5*b* is provided to the gate electrode 5*a*, a channel layer is formed between the n+-type semiconductor layer (the n+-type source layer) 1*b* and the n+-type semiconductor layer (the n+-type drain layer) 1*c* and the MOSFET is turned on. In an off-state, the voltage of the gate electrode 5*a* is changed to 0 V, which causes no channel layer to be formed and the MOSFET to be turned off.

Figure 3:
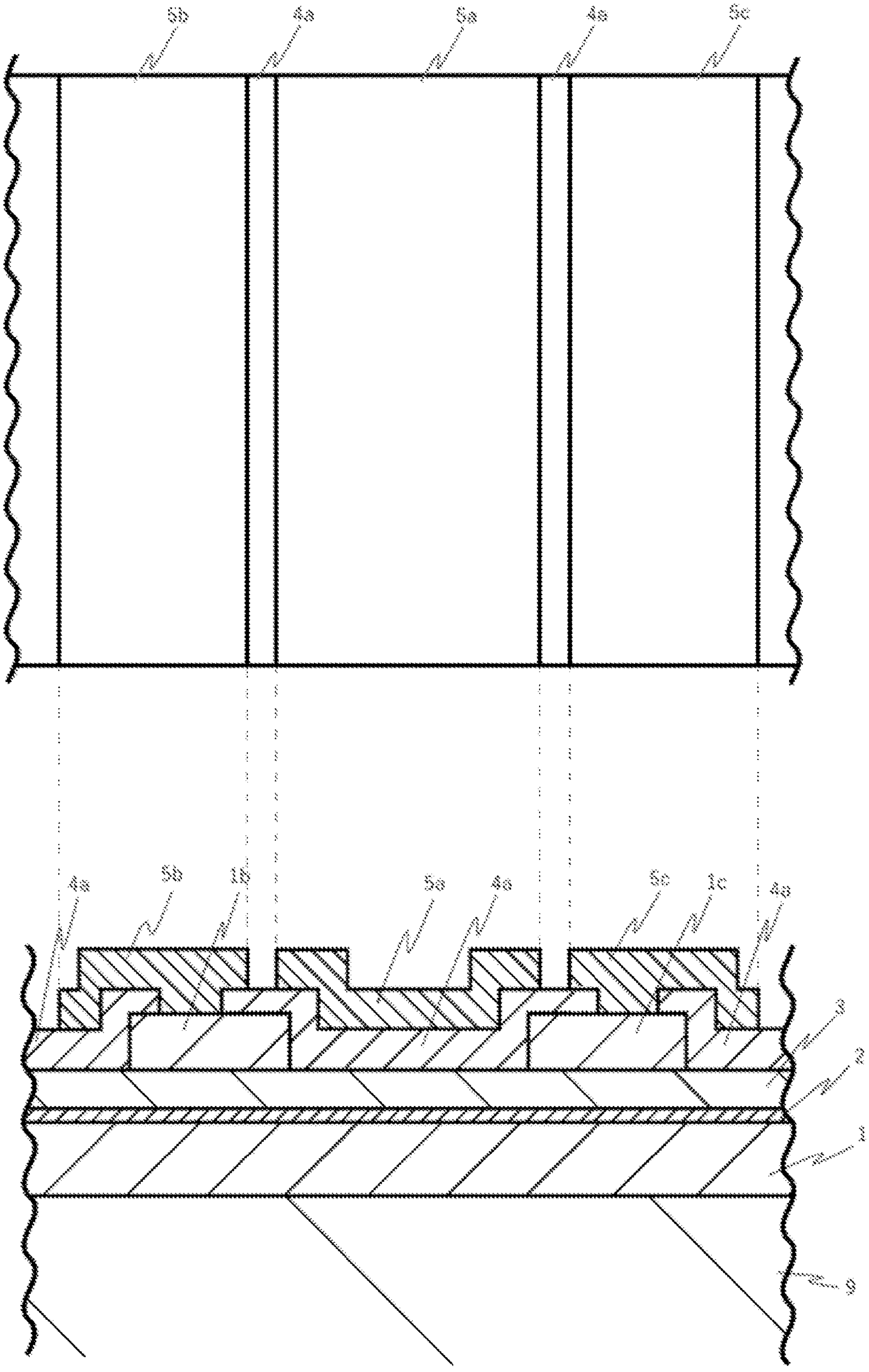
FIG. 3 is a diagram schematically showing a suitable embodiment of the MOSFET of the present disclosure as one example; (a) schematically showing a top surface of the MOSFET and (b) schematically showing a cross section of (a).

An embodiment of a MOSFET is shown in FIG. 3 as one example of the semiconductor device of the present disclosure. It is to be noted that FIG. 3(*a*) is a top view of the MOSFET viewed from a zenith direction and schematically shows a top surface of the MOSFET. Moreover, FIG. 3(*b*) schematically shows a cross section of the MOSFET of FIG. 3(*a*). The MOSFET of FIG. 3 is a horizontal MOSFET and includes an n+-type semiconductor layer 1, an n−-type semiconductor layer 3, an n+-type semiconductor layer (an n+-type source layer) 1*b*, an n+-type semiconductor layer (an n+-type drain layer) 1*c*, a high-resistance oxide film 2, a gate insulating film 4*a*, a gate electrode 5*a*, a source electrode 5*b*, a drain electrode 5*c*, and a substrate 9. In an on-state of the MOSFET of FIG. 3, when a voltage is applied between the source electrode 5*b* and the drain electrode 5*c* and a voltage which is positive with respect to the source electrode 5*b* is provided to the gate electrode 5*a*, a channel layer is formed between the n+-type semiconductor layer (the n+-type source layer) 1*b* and the n+-type semiconductor layer (the n+-type drain layer) 1*c* and the MOSFET is turned on. It is to be noted that a current is induced by the high-resistance oxide film 2 so as to suppress a leakage current and the like. Furthermore, in an off-state, the voltage of the gate electrode 5*a* is changed to 0 V, which causes no channel layer to be formed and the MOSFET to be turned off.

Figure 4:
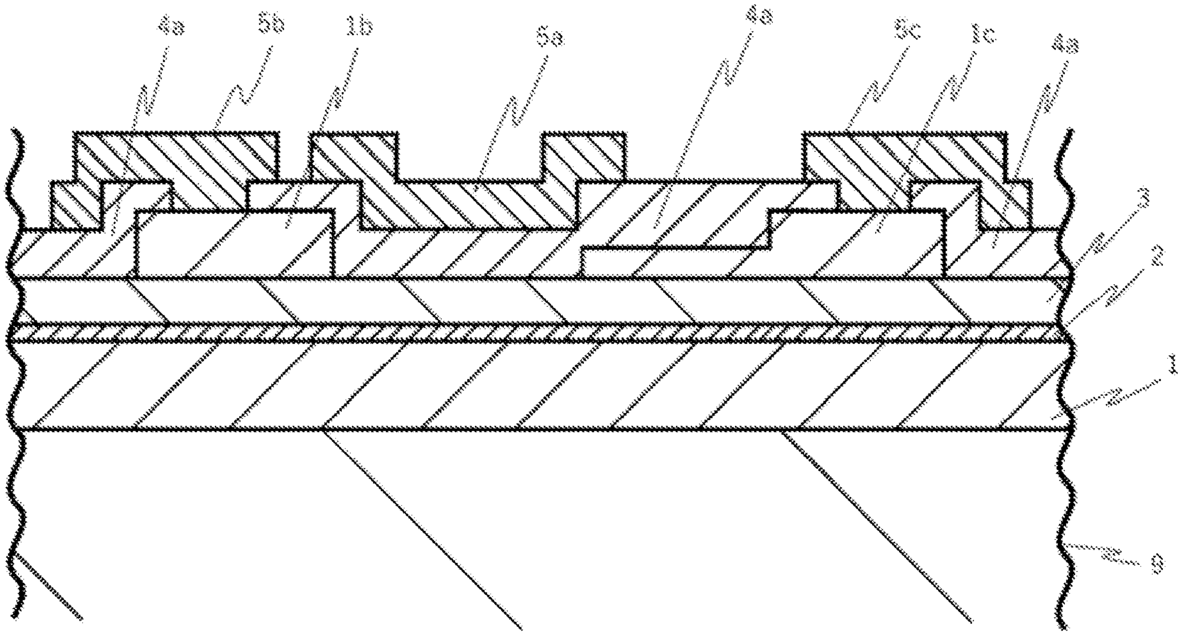
FIG. 4 is a diagram schematically showing a suitable embodiment of the MOSFET of the present disclosure as one example.

An embodiment of a MOSFET is shown in FIG. 4 as one example of the semiconductor device of the present disclosure. The MOSFET of FIG. 4 is a horizontal MOSFET and includes an n+-type semiconductor layer 1, an n−-type semiconductor layer 3, an n+-type semiconductor layer (an n+-type source layer) 1*b*, an n+-type semiconductor layer (an n+-type drain layer) 1*c*, a high-resistance oxide film 2, a gate insulating film 4*a*, a gate electrode 5*a*, a source electrode 5*b*, a drain electrode 5*c*, and a substrate 9. Unlike the MOSFET of FIG. 3, the MOSFET of FIG. 4 includes the mesa n+-type semiconductor layer (n+-type drain layer) 1*c* having a step structure. The height of the n+-type semiconductor layer (the n+-type drain layer) 1*c* is low on the gate electrode and high on the drain electrode side. This configuration makes it possible to achieve a semiconductor device with higher withstand voltage.

Figure 5:
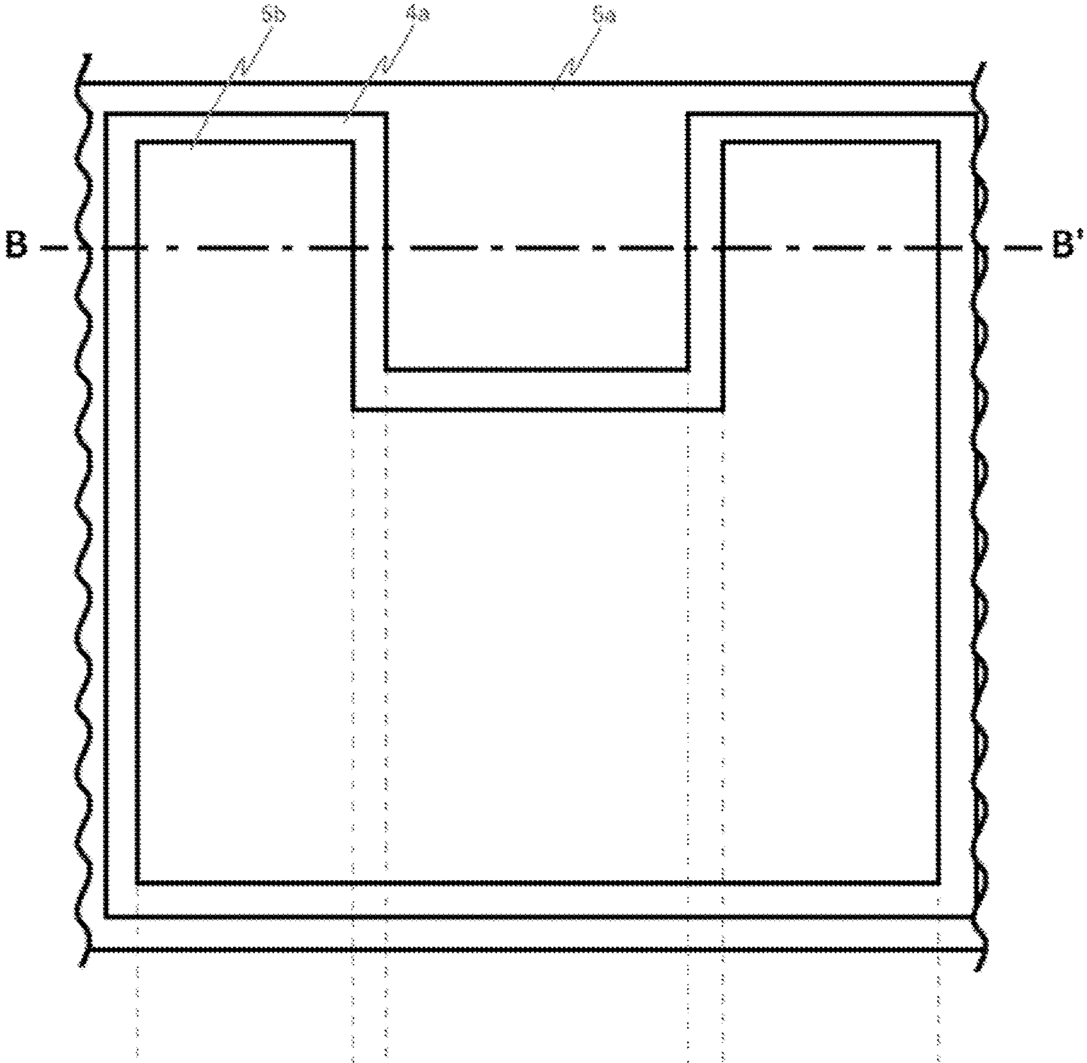
FIG. 5 is a diagram schematically showing a suitable embodiment of the MOSFET of the present disclosure as one example; (a) schematically showing a top surface of the MOSFET and (b) schematically showing a cross section taken along B-B' of (a).
Figure 5:
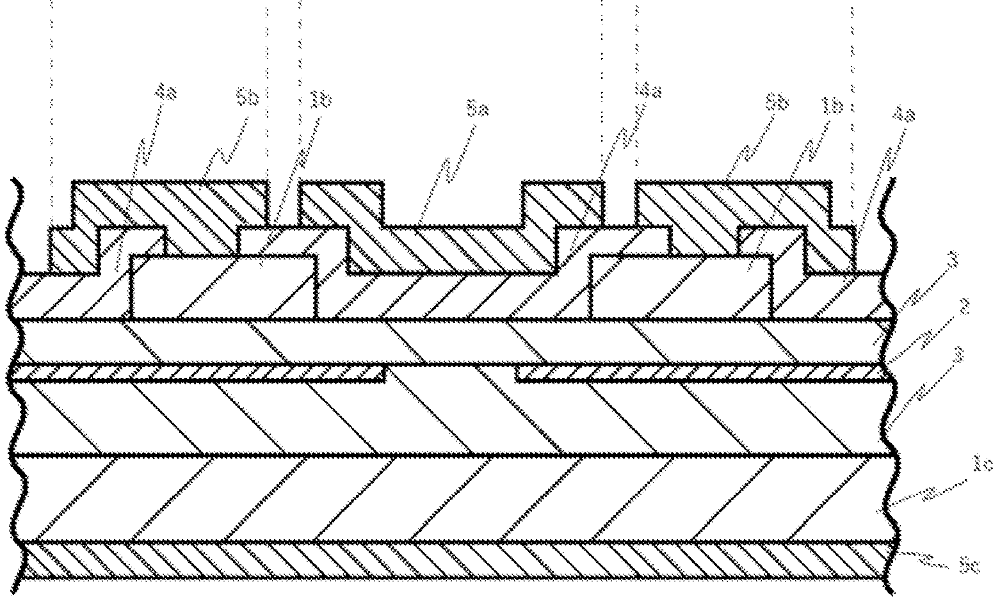
Figure 6:
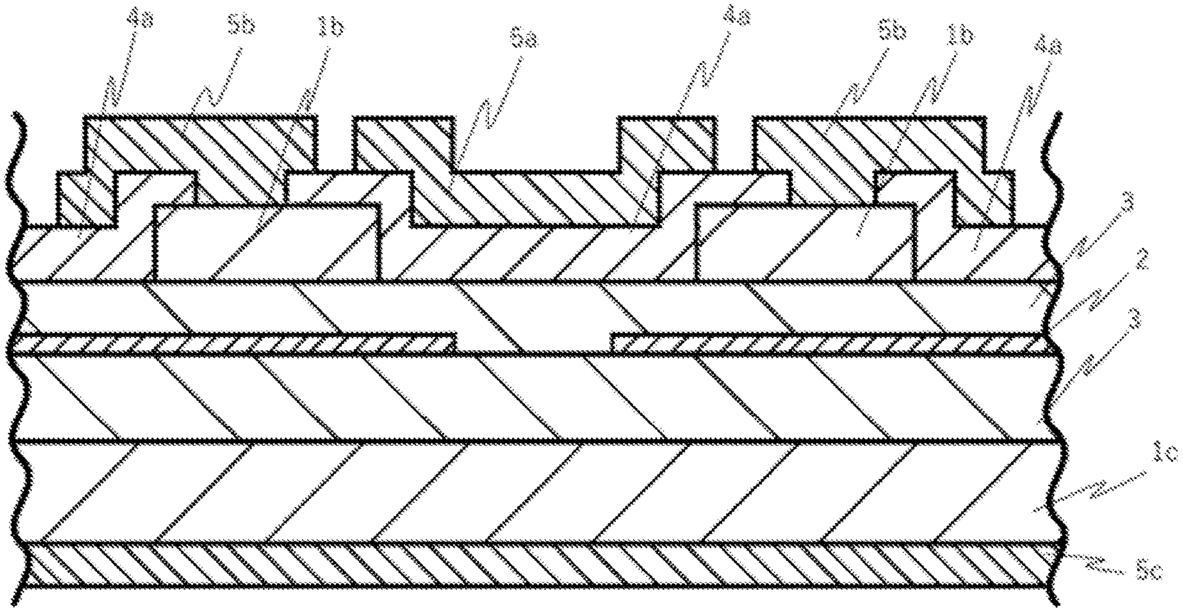
FIG. 6 is a diagram schematically showing a suitable embodiment of the MOSFET of the present disclosure as one example.

An embodiment of a MOSFET is shown in FIG. 5 as one example of the semiconductor device of the present disclosure. It is to be noted that FIG. 5(*a*) is a top view of the MOSFET viewed from a zenith direction and schematically shows a top surface of the MOSFET. Moreover, FIG. 5(*b*) schematically shows a cross section of the MOSFET taken along B-B' of FIG. 5(*a*). The MOSFET of FIG. 5 is a vertical MOSFET and is a semiconductor device that may achieve higher withstand voltage and higher current. Furthermore, the MOSFET of FIG. 5 includes an n+-type semiconductor layer (an n+-type source layer) 1*b*, an n+-type semiconductor layer (an n+-type drain layer) 1*c*, a high-resistance oxide film 2, an n−-type semiconductor layer 3, a gate insulating film 4*a*, a gate electrode 5*a*, a source electrode 5*b*, a drain electrode 5*c*, and a substrate 9. The high-resistance oxide film 2 has an opening below the gate electrode 5*a*. By making the width of the opening larger than that of the gate electrode, it is possible to lower the on-resistance; by making the width of the opening smaller than that of the gate electrode, it is possible to improve the withstand voltage. The opening may be formed by performing etching or the like using a publicly known method. In an embodiment of the present disclosure, for example, an opening may be formed by etching or the like after the high-resistance oxide film is formed, or an opening may be formed by forming an n−-type semiconductor layer and then forming a high-resistance oxide film with a mask in an area which will become an opening and removing the mask. An example of a high-resistance oxide film having an opening formed by the latter method is shown in FIG. 6. Unlike the MOSFET of FIG. 5, a MOSFET of FIG. 6 shows an example in which an opening is provided inside an n−-type semiconductor layer on the gate electrode side. In an embodiment of the present disclosure, both the MOSFET of FIG. 5 and the MOSFET of FIG. 6 can be suitably used.

Figure 8:
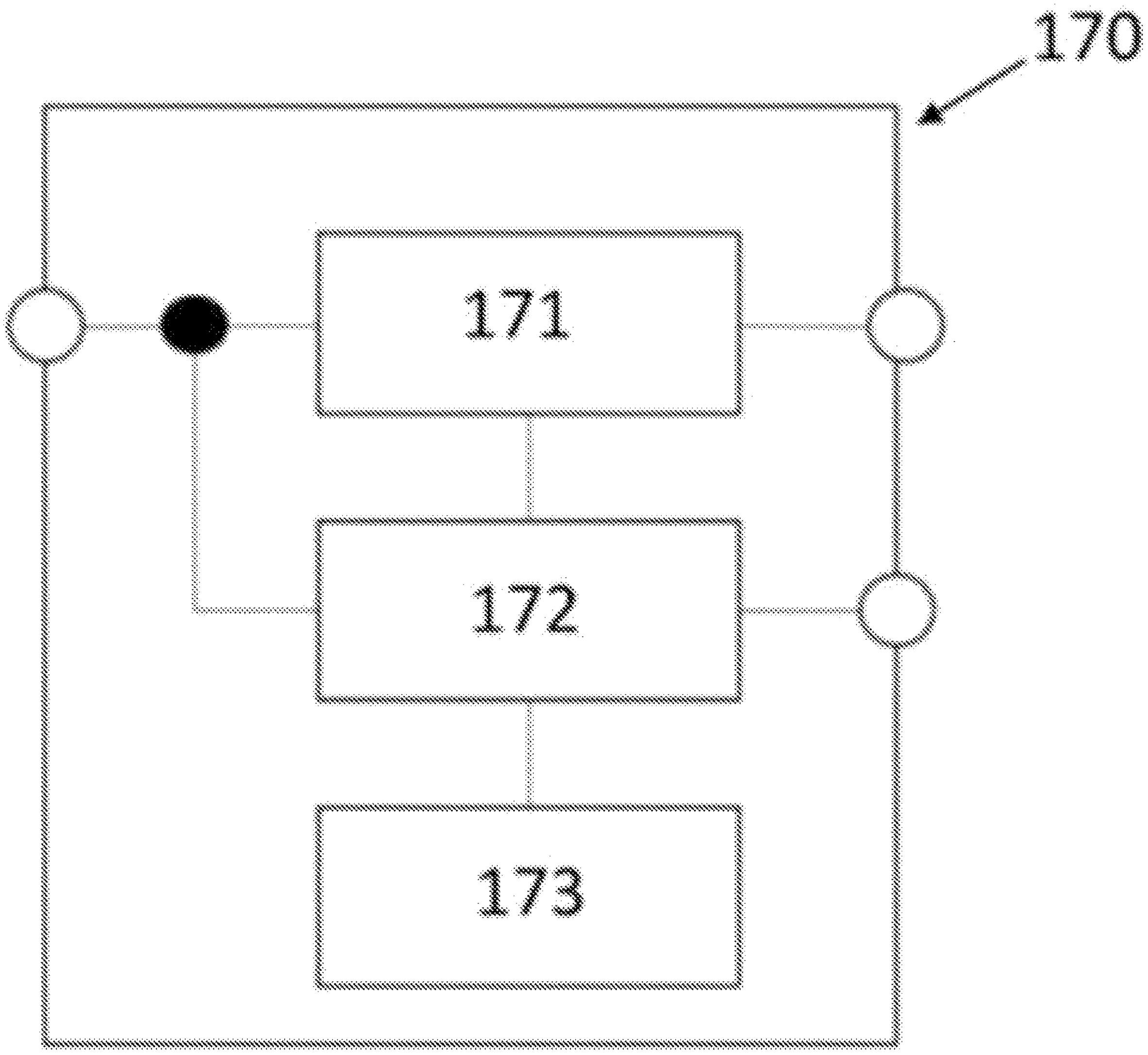
FIG. 8 is a diagram schematically showing a suitable example of a power supply system.
Figure 9:
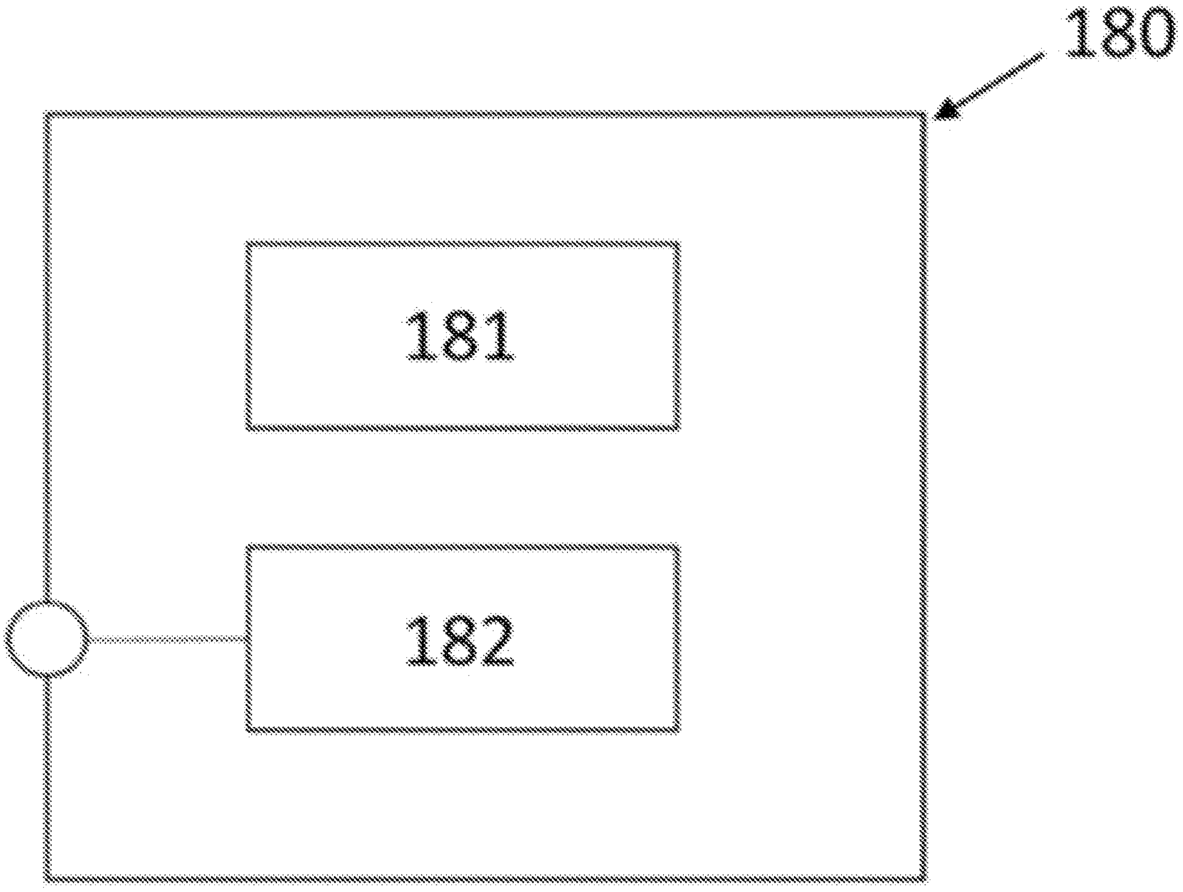
FIG. 9 is a diagram schematically showing a suitable example of a system unit.
Figure 10:
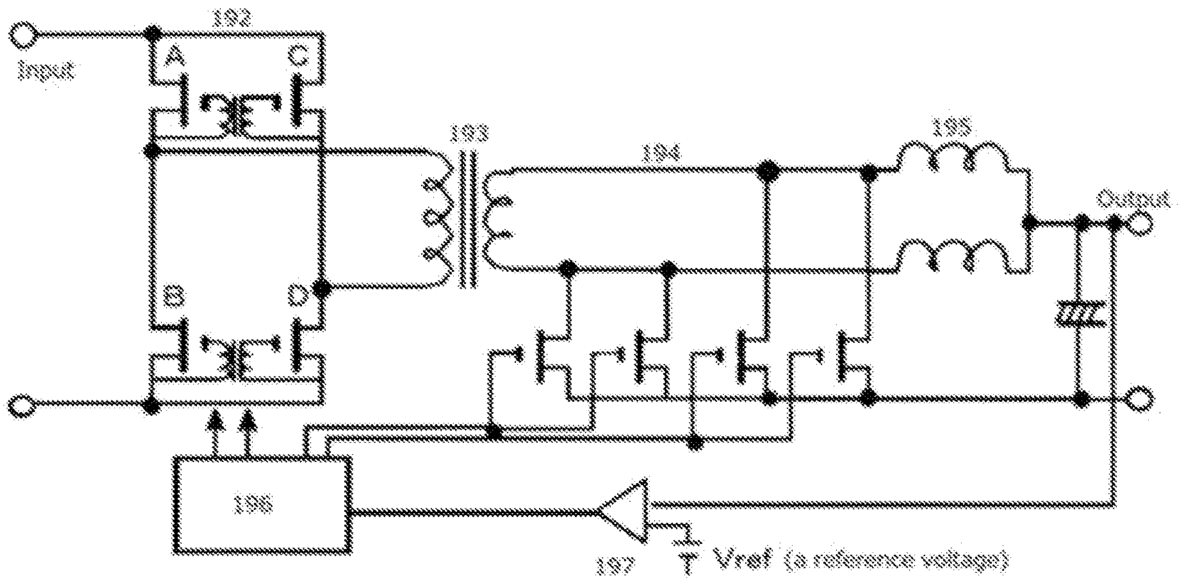
FIG. 10 is a diagram schematically showing a suitable example of a power supply circuit diagram of a power supply device.

By using a publicly known method in addition to the above-described matter, the semiconductor device of the present disclosure is suitably used as a power module, an inverter, or a converter and is suitably used in a semiconductor system or the like using a power supply device, for example. The power supply device can be fabricated from the semiconductor device or as the semiconductor device by connecting it to a wiring pattern or the like using a publicly known method. An example of a power supply system is shown in FIG. 8. FIG. 8 shows a power supply system 170 configured with a plurality of the power supply devices 171 and 172 and a control circuit 173. As shown in FIG. 9, the power supply system 170 may be used in a system unit 180 by combining an electronic circuit 181 and a power supply system 182 (that is, the power supply system 170 of FIG. 8). It is to be noted that one example of a power supply circuit diagram of a power supply device is shown in FIG. 10. FIG. 10 shows a power supply circuit of a power supply device configured with a power circuit and a control circuit, the power supply circuit in which a DC voltage is converted into AC by being switched at high frequencies by an inverter 192 (which is configured with MOSFETs A to D) and then electrical insulation and voltage transformation are performed by a transformer 193, rectification is performed by rectification MOSFETs 194 (A to B') and smoothing is then performed by a DCL 195 (smoothing coils L1 and L2) and a capacitor, and a direct-current voltage is output. At the time of output, the output voltage is compared with a reference voltage by a voltage comparator 197, and the inverter 192 and a rectification MOSFET 194 are controlled by a PWM control circuit 196 so as to obtain a desired output voltage.

EMBODIMENTS

(First Embodiment) Production of MOSFET Shown in FIG. 2

1. Formation of p-Type Semiconductor Layer (High-Resistance Oxide Film)

1-1. Film Forming Equipment

The film forming equipment 19 of FIG. 1 was used.

1-2. Preparation of Raw Material Solution

A 0.1 M aqueous solution of gallium bromide was made to contain 20% hydrobromic acid in terms of volume ratio and Mg was then added to the solution such that the solution contains 10 vol % Mg, and the obtained solution was used as a raw material solution.

1-3. Preparations for Film Formation

The raw material solution 24*a* obtained in 1-2. above was housed in the mist generation source 24. Then, a sapphire substrate was placed on a susceptor 21 as the substrate 20 and the temperature inside the film formation chamber 30 was raised to 520° C. by activating the heater 28. Next, the carrier gas was supplied to the inside of the film formation chamber 30 from the carrier gas supply sources 22*a* and 22*b*, which are carrier gas sources, by opening the flow control valves 23*a* and 23*b* and the atmosphere inside the film formation chamber 30 was sufficiently replaced with the carrier gas, and then the flow rate of the carrier gas was adjusted to 1 LPM and the flow rate of the carrier gas (dilute) was adjusted to 1 LPM. It is to be noted that nitrogen was used as the carrier gas.

1-4. Formation of Semiconductor Film

Next, the ultrasonic vibrator 26 was vibrated at 2.4 MHz and the vibrations were transferred to the raw material solution 24*a* through the water 25*a*, whereby the raw material solution 24*a* was atomized and mist was generated. This mist was introduced into the film formation chamber 30 by the carrier gas and reacted with each other inside the film formation chamber 30 at 520° C. under atmospheric pressure, whereby a p-type semiconductor layer (a high-resistance oxide film) was formed on the substrate 20. It is to be noted that a film thickness was 0.6 μm and the film formation time was 15 minutes.

1-5. Evaluations

An identification of the phase of the film obtained in 1-4. above, which was made using an XRD diffraction instrument, revealed that the obtained film was $\alpha$-$Ga_2O_3$.

2. Formation of n+-Type Semiconductor Region

An n+-type semiconductor film was formed on the p-type semiconductor layer obtained in 1. above in a manner similar to that described in 1. above except that a 0.1 M aqueous solution of gallium bromide was made to contain 10% hydrobromic acid and 8% tin bromide in terms of volume ratio and the obtained solution was used as a raw material solution and the film formation temperature was set at 580° C. and the film formation time was set at 5 minutes. An identification of the phase of the obtained film, which was made using the XRD diffraction instrument, revealed that the obtained crystalline oxide semiconductor film was $\alpha$-$Ga_2O_3$ and had a band gap of 3 eV or more.

3. Formation of Gate Insulating Film and Electrodes

After the n+-type semiconductor layer in a region (between 1*b* and 1*c*) corresponding to a gate portion was etched by phosphoric acid and treatment using phosphoric acid was performed such that an oxide film containing at least phosphorus was formed on the p-type semiconductor layer, a film of $SiO_2$ was formed as a gate insulating film using TEOS. It is to be noted that measurement of the resistance of the high-resistance oxide film, which was conducted by forming measuring electrodes in the high-resistance oxide film and passing a current, revealed that the resistance was $1.0\times10^{12}$ Ω·cm or higher. Moreover, photolithography, etching processing, electron-beam evaporation and so forth were performed, whereby a MOSFET was produced as shown in FIG. 2. It is to be noted that Ti was used in each electrode.

(Evaluations)

Figure 7:
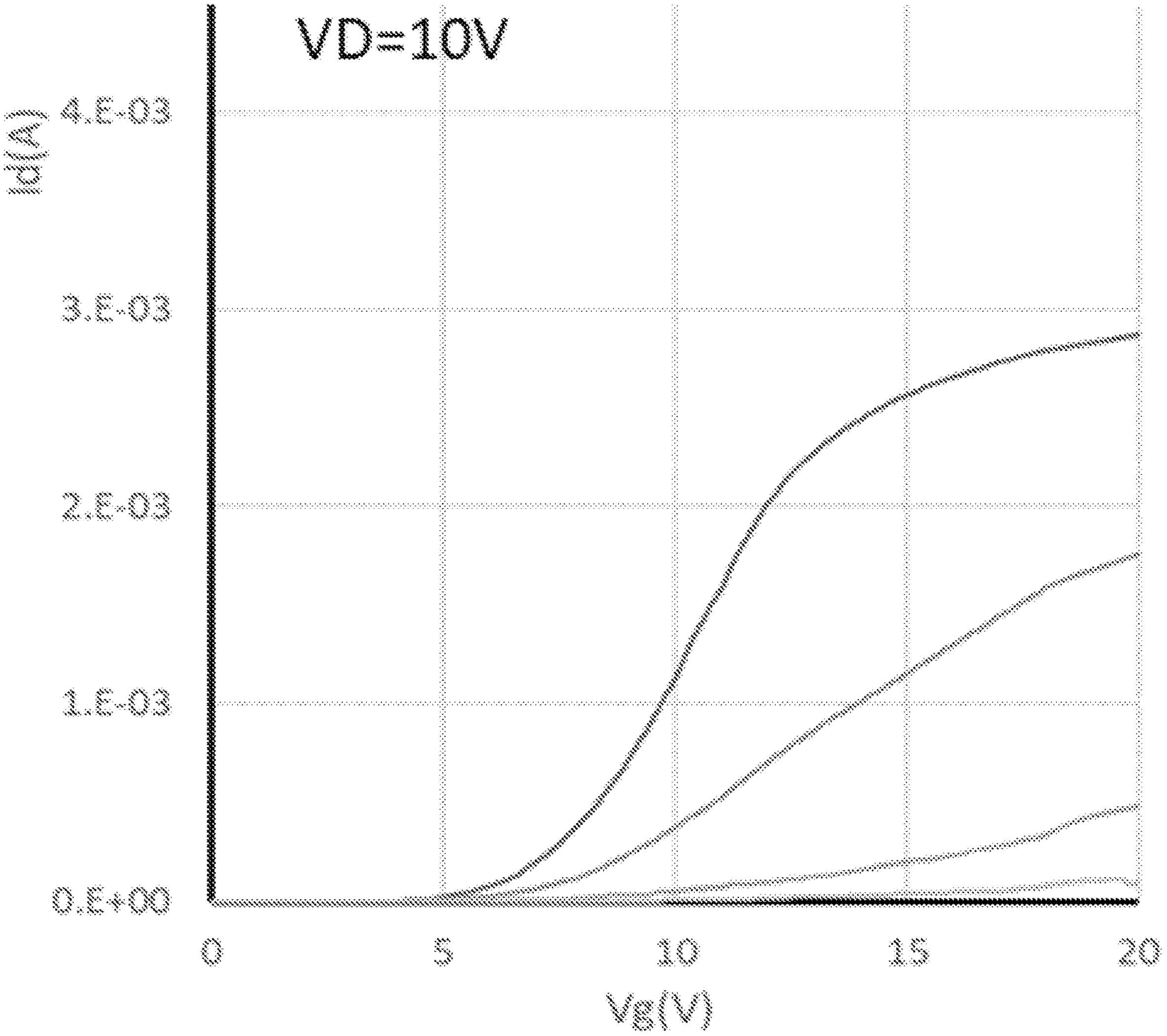
FIG. 7 is a diagram showing the IV measurement results in the embodiment.

IV measurement was performed on the obtained MOSFETs. The IV measurement results are shown in FIG. 7. As is clear from FIG. 7, the results indicated that high-mobility MOSFETs of a gallium oxide semiconductor with an inversion channel formation region formed therein were successfully produced and also demonstrated that the MOSFETs operated satisfactorily as a transistor. It is to be noted that the evaluations of the Id-Vg characteristics (Vd=10 V) based on FIG. 7 revealed that the MOSFETs had a field-effect mobility of 62.52 $cm^2/V\cdot s$, a field-effect mobility of 116.9 $cm^2/V\cdot s$, and a field-effect mobility of 54.55 $cm^2/V\cdot s$ (when Vg was 20 V) and had a field-effect mobility of 102.5 $cm^2/V\cdot s$, a field-effect mobility of 131.6 $cm^2/V\cdot s$, and a field-effect mobility of 36.85 $cm^2/V\cdot s$ (when Vg was 14 V). Moreover, the gate-voltage threshold voltage determined from the obtained IV characteristics was 7 V or more. Furthermore, the on/off ratio was 10000000.

INDUSTRIAL APPLICABILITY

The semiconductor device of the present disclosure may be used in all the fields such as semiconductors (for example, a compound semiconductor electronic device), electronic parts, electrical apparatus parts, optical and electronic photograph-related equipment, and industrial components, and is particularly useful for power devices.

The embodiments of the present invention are exemplified in all respects, and the scope of the present invention includes all modifications within the meaning and scope equivalent to the scope of claims.

REFERENCE SIGNS LIST

1 n+-type semiconductor layer
1*b* n+-type semiconductor layer (n+-type source layer)
1*c* n+-type semiconductor layer (n+-type drain layer)
2 high-resistance oxide film
3 n−-type semiconductor layer
4*a* gate insulating film
5*a* gate electrode
5*b* source electrode
5*c* drain electrode
9 substrate
19 mist CVD equipment
20 substrate
21 susceptor
22*a* carrier gas supply source
22*b* carrier gas (dilute) supply source
23*a* flow control valve
23*b* flow control valve
24 mist generation source
24*a* raw material solution
25 container
25*a* water
26 ultrasonic vibrator
27 supply pipe
28 heater
29 exhaust port
170 power supply system

171 power supply device
172 power supply device
173 control circuit
180 system unit
181 electronic circuit
182 power supply system
192 inverter
193 transformer
194 rectification MOSFET
195 DCL
196 PWM control circuit
197 voltage comparator

What is claimed is:

1. A semiconductor device comprising at least:

a crystalline oxide semiconductor layer having a band gap of 3 eV or more; and a high-resistance oxide film on which the crystalline oxide semiconductor layer is located, wherein the high-resistance oxide film has a resistance of $1.0\times10^{6}$ Ω·cm or higher, and wherein the semiconductor device has a field-effect mobility of 30 $cm^2$/V's or higher.

2. The semiconductor device according to claim 1, wherein the crystalline oxide semiconductor layer is in contact with a gate insulating film and contains $Ga_2O_3$ or a mixed crystal thereof.

3. A semiconductor device comprising at least:

a crystalline oxide semiconductor layer having a band gap of 3 eV or more, wherein the crystalline oxide semiconductor layer is in contact with a gate insulating film and contains $Ga_2O_3$ or a mixed crystal thereof, wherein the semiconductor device has a field-effect mobility of 30 $cm^2$/V·s or higher, and wherein the semiconductor device is configured to allow a drain current to flow upon a drain voltage (Vd) being 10 V and a gate voltage (Vg) being 4 V or more.

4. A semiconductor device comprising at least:

a crystalline oxide semiconductor layer having a band gap of 3 eV or more, wherein the crystalline oxide semiconductor layer is in contact with a gate insulating film and contains $Ga_2O_3$ or a mixed crystal thereof, wherein the semiconductor device has a field-effect mobility of 30 $cm^2$/V·s or higher, and wherein the semiconductor device is configured to allow a drain current of 10 μA or more to flow upon drain voltage (Vd) being 10 V and gate voltage (Vg) being 5 V or more.

* * * * *